US010944414B1

United States Patent
Vaz et al.

(12) United States Patent
(10) Patent No.: US 10,944,414 B1
(45) Date of Patent: Mar. 9, 2021

(54) METHOD AND APPARATUS FOR PSUEDO-RANDOM INTERLEAVED ANALOG-TO-DIGITAL CONVERTER USE

(71) Applicant: Xilinx, Inc., San Jose, CA (US)

(72) Inventors: Bruno Miguel Vaz, Alcabideche (PT); Bob W. Verbruggen, Dublin (IE); Christophe Erdmann, Dublin (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/922,873

(22) Filed: Jul. 7, 2020

(51) Int. Cl.
*H03M 1/00* (2006.01)
*H03M 1/12* (2006.01)
*H03M 1/06* (2006.01)

(52) U.S. Cl.
CPC ....... *H03M 1/1215* (2013.01); *H03M 1/0641* (2013.01)

(58) Field of Classification Search
CPC .... H03M 1/0641; H03M 1/1215; H03M 1/12; H03M 1/00; H03M 3/30; H03M 1/1245; H03M 1/06; H03M 1/0607; H03M 1/188; H03M 1/36; H03M 1/70; H03M 3/47; H03M 1/007; H03M 3/468; H03M 3/42
USPC ........................................ 341/131, 141, 159
See application file for complete search history.

(56) References Cited

U.S. PATENT DOCUMENTS

| | | | | |
|---|---|---|---|---|
| 6,982,664 | B1 * | 1/2006 | Nairn | H03M 1/0624 341/118 |
| 2005/0190089 | A1 * | 9/2005 | Draxelmayr | H03M 1/0624 341/141 |
| 2008/0180289 | A1 * | 7/2008 | Su | H03M 1/1009 341/120 |
| 2012/0050082 | A1 * | 3/2012 | Danesh | H03M 1/1215 341/122 |
| 2016/0049949 | A1 * | 2/2016 | Waltari | H03M 1/1023 341/120 |
| 2016/0344400 | A1 * | 11/2016 | Ramakrishnan | H03M 1/0626 |
| 2018/0026781 | A1 * | 1/2018 | Otte | H03M 1/0673 375/355 |
| 2020/0343899 | A1 * | 10/2020 | Wu | H03M 1/121 |

OTHER PUBLICATIONS

Devarajan et al., "A 12b 10GS/s Interleaved Pipeline ADC in 28nm CMOS Technology," Digest of Technical Papers, IEEE International Solid-State Circuits Conference 2017, Session 16, Gigahertz Data Converters, 16.7, Feb. 7, 2017.

* cited by examiner

*Primary Examiner* — Linh V Nguyen
(74) *Attorney, Agent, or Firm* — Paradice and Li LLP

(57) ABSTRACT

An apparatus and method for sampling an analog signal with analog-to-digital converters (ADCs) is disclosed. The ADCs may be separated into a group of interleaved ADCs and a spare ADC. The interleaved ADCs can sample the analog signal according to an interleaving sequence. An interleaved ADC controller can monitor the inactivity of the spare ADC and can replace one of the interleaved ADCs in the interleaving sequence with the spare ADC based on the inactivity.

20 Claims, 4 Drawing Sheets

METHOD AND APPARATUS FOR PSUEDO-RANDOM INTERLEAVED ANALOG-TO-DIGITAL CONVERTER USE

TECHNICAL FIELD

Aspects of the present disclosure generally relate to analog-to-digital converters (ADCs), and specifically to a method and apparatus for pseudo-random interleaved ADC use.

BACKGROUND

The use of analog-to-digital converters (ADCs) increases each day. For example, ADCs are used to couple analog sensors and transducers to the digital domain. In another example, ADCs are used to receive wired and wireless communication signals. In some cases, interleaved ADCs may be used to provide a higher effective sampling rate with slower ADCs. A circuit with interleaved ADCs uses two or more ADCs to sequentially sample an analog signal. Thus, the sampling rate of the analog signal is multiplied by the number of ADCs used.

Although the use of interleaved ADCs can increase the effective sampling rate, other problems are introduced. For example, because each of the interleaved ADCs may be slightly different (e.g., each ADC may have a different frequency response or non-linearity), sampling errors may be introduced when sampling symmetric, or quasi-symmetric periodic signals. Randomized ADC usage may be used to address these and other interleaved ADC issues. To randomize ADC usage, a "spare" or "unused" ADC is kept in reserve and randomly (or pseudo-randomly) used to replace one of the current ADCs used in an interleaving sequence. Strict random use of a spare ADC may introduce other performance or accuracy issues.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to sampling an analog signal with interleaved analog-to-digital converters (ADCs). An interleaved ADC controller may include a counter and an ADC selector. The counter may be configured to increment a count value based on a number of elapsed clock cycles of a sample clock. The ADC selector may be coupled to a number (N) of ADC and be configured to select a first subset of the N ADCs to sample an analog signal in an interleaving sequence, the interleaving sequence including N−1 ADCs, and selectively adjust the interleaving sequence to include a second subset of the N ADCs based at least in part on the count value of the counter, the second subset of ADCs being different than the first subset.

An interleaved analog-to-digital converter (ADC) system is disclosed that may include a number (N) of ADCs configured to sample an analog signal and an interleaved ADC controller. The interleaved ADC controller may include a counter and an ADC selector. The counter may be configured to increment a count value based on a number of elapsed clock cycles of a sample clock. The ADC selector may be coupled to a number (N) of ADCs and be configured to select a first subset of the N ADCs to sample an analog signal in an interleaving sequence, the interleaving sequence including N−1 ADCs, and selectively adjust the interleaving sequence to include a second subset of the N ADCs based at least in part on the count value of the counter, the second subset of N ADCs being different than the first subset An example method is disclosed for sampling an analog signal with a number (N) of interleaved analog-to-digital converts (ADCs). The method may include incrementing a count value of a counter based on a number of elapsed clock cycles of a sample clock, and selecting a first subset of the N ADCs to sample the analog signal in an interleaving sequence, the interleaving sequence including N−1 ADCs. The method may also include selectively adjusting the interleaving sequence to include a second subset of the N ADCs based at least in part on the count value of the counter, the second subset of ADCs being different than the first subset.

BRIEF DESCRIPTION OF THE DRAWINGS

The example implementations are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Aspects of the present disclosure may provide a method and apparatus for sampling an analog signal with interleaved analog-to-digital converters (ADCs). An interleaved ADC system is disclosed. The interleaved ADC system may include a number (N) of ADCs and an interleaved ADC controller. Of the N ADCs, a subset of N−1 ADCs may participate in an interleaving sequence to sample the analog signal at any given time. As used herein, the term "spare ADC" may refer to any ADC that is not part of the interleaving sequence. The interleaved ADC controller may monitor an idle duration of the spare ADC (e.g., a period during which the spare ADC is not being used to sample the analog signal). In some implementations, the interleaved ADC controller may substitute the spare ADC into the interleaving sequence if the idle duration is greater than or equal to a threshold. The spare ADC may take the place of another ADC in the interleaving sequence (where the ADC being replaced subsequently becomes the spare ADC).

Figure 1:
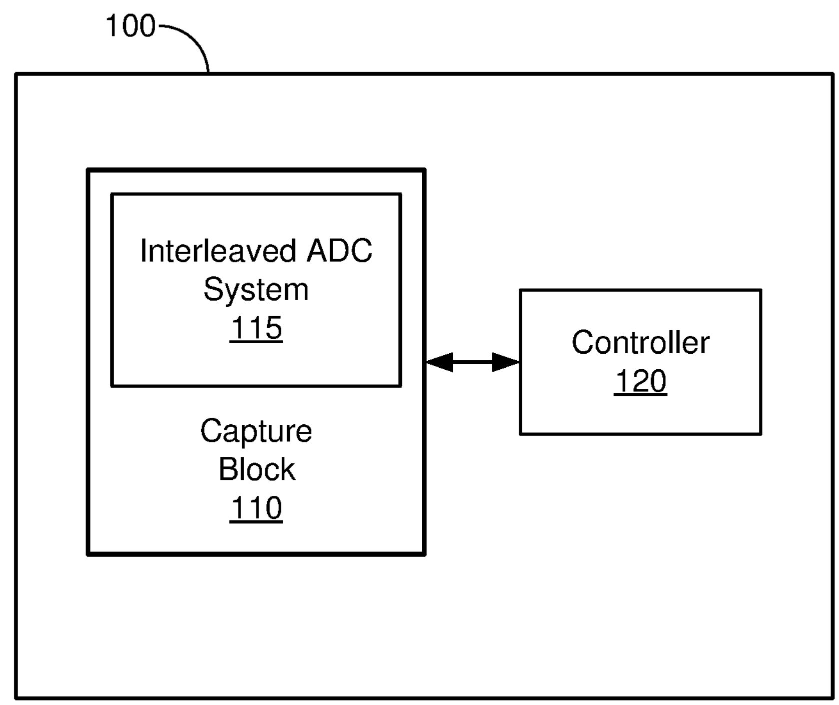
FIG. 1 shows a block diagram of an example integrated circuit.

FIG. 1 shows a block diagram of an example integrated circuit 100. The integrated circuit 100 may include a capture block 110 and a controller 120. The capture block 110 may receive one or more analog signals and convert them into digital signals. For example, the capture block 110 may receive single-ended or differential analog communication signals that may be associated with ethernet signals, serdes signals, or the like. In another example, the capture block 110 may receive downconverted analog RF signals. The controller 120 may receive and process digital signals from the capture block 110.

The capture block 110 may include an interleaved ADC system 115. In some implementations, the interleaved ADC system 115 may include three or more ADCs and an ADC controller to control sequencing of the ADCs. The ADCs and the ADC controller are not shown for simplicity but are described in more detail with respect to FIG. 2.

Figure 2:
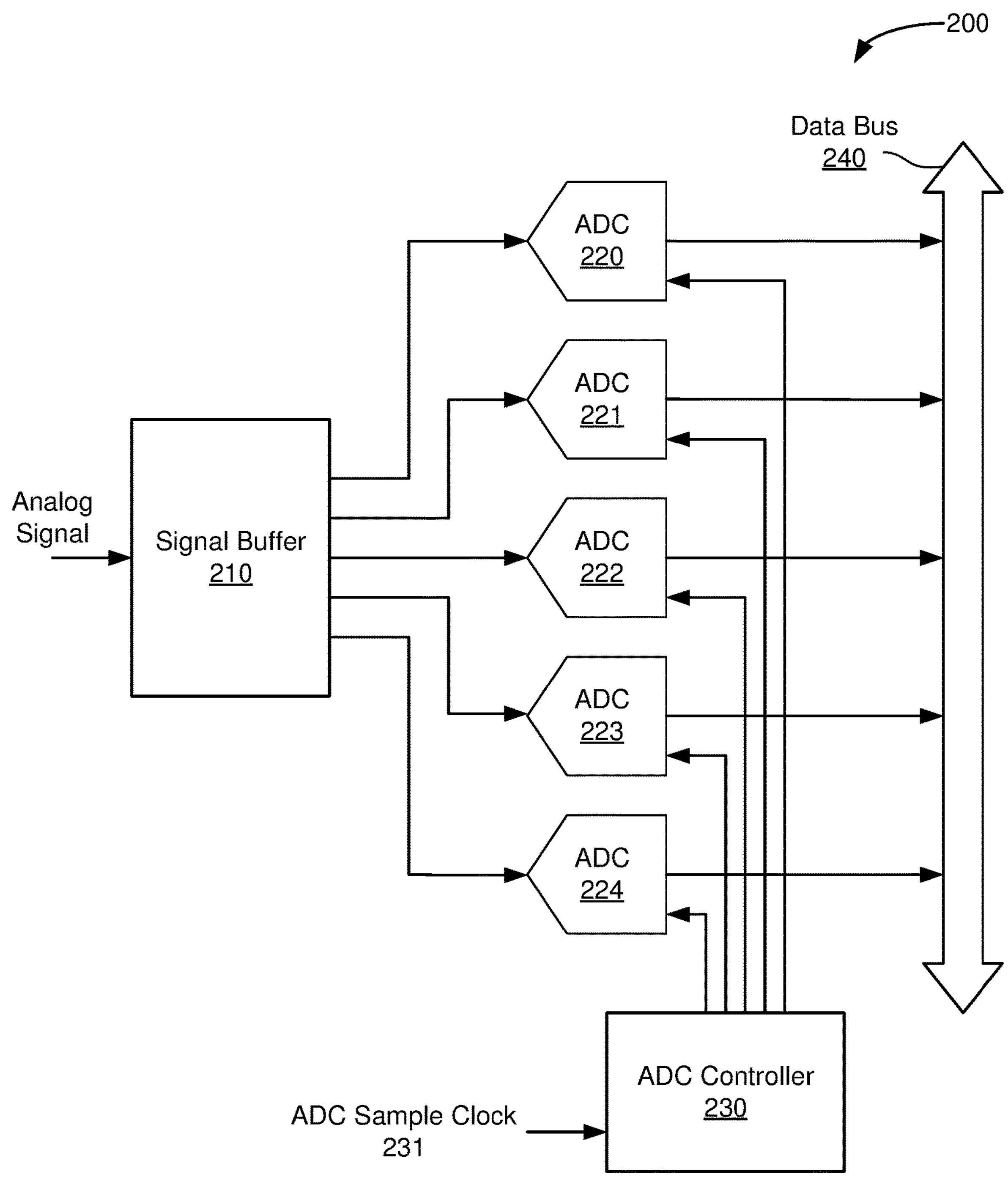
FIG. 2 is a block diagram of an example interleaved ADC system.

FIG. 2 is a block diagram of an example interleaved ADC system 200. The interleaved ADC system 200 may be one example of the interleaved ADC system 115 of FIG. 1 and include a signal buffer 210, ADCs 220-224, an interleaved ADC controller 230, and a data bus 240. Although five (N=5) ADCs are depicted in the example of FIG. 2, in other implementations, the interleaved ADC system 200 may include any feasible number of ADCs.

The interleaved ADC controller 230 may be coupled to each of the ADCs 220-224 and determine an interleaving sequence of the ADCs 220-224. The interleaved ADC controller 230 also may control analog signal sampling by the ADCs 220-224 based on the interleaving sequence and an ADC sample clock 231. The ADC sample clock 231 may be a clock signal with a frequency related to and/or based on an overall sampling frequency of the interleaved ADC system 200. In some implementations, the interleaved ADC controller 230 may determine when to substitute a spare ADC for an ADC in the interleaving sequence.

The signal buffer 210 may receive, buffer, and distribute an analog signal to the ADCs 220-224. The ADCs 220-224 may sample the analog signal in an interleaved (e.g., sequential) fashion. In some implementations, four of the five (N−1) ADCs 220-224 may be included in an interleaving sequence at any given time while one of the five ADCs 220-224 may be reserved as the spare ADC. For example, the interleaving sequence may include ADCs 220-223 and the spare ADC may be ADC 224. During a given period, the ADCs 220-223 may individually sample, in turn, the analog signal in according to the interleaving sequence. Thus, each of the ADCs 220-223 may sequentially sample the analog signal during a time period associated with four ADC sample clock 231 cycles. The effective sampling rate of the interleaved ADC system 200 is the frequency of the ADC sample clock 231. During another period, the ADC 224 (e.g., the spare ADC) may be substituted for one of the ADCs 220-223 in the interleaving sequence. Digital data from the ADCs 220-224 is output to the data bus 240, which may be coupled to the controller 120 of FIG. 1 (not shown for simplicity).

Figure 3:
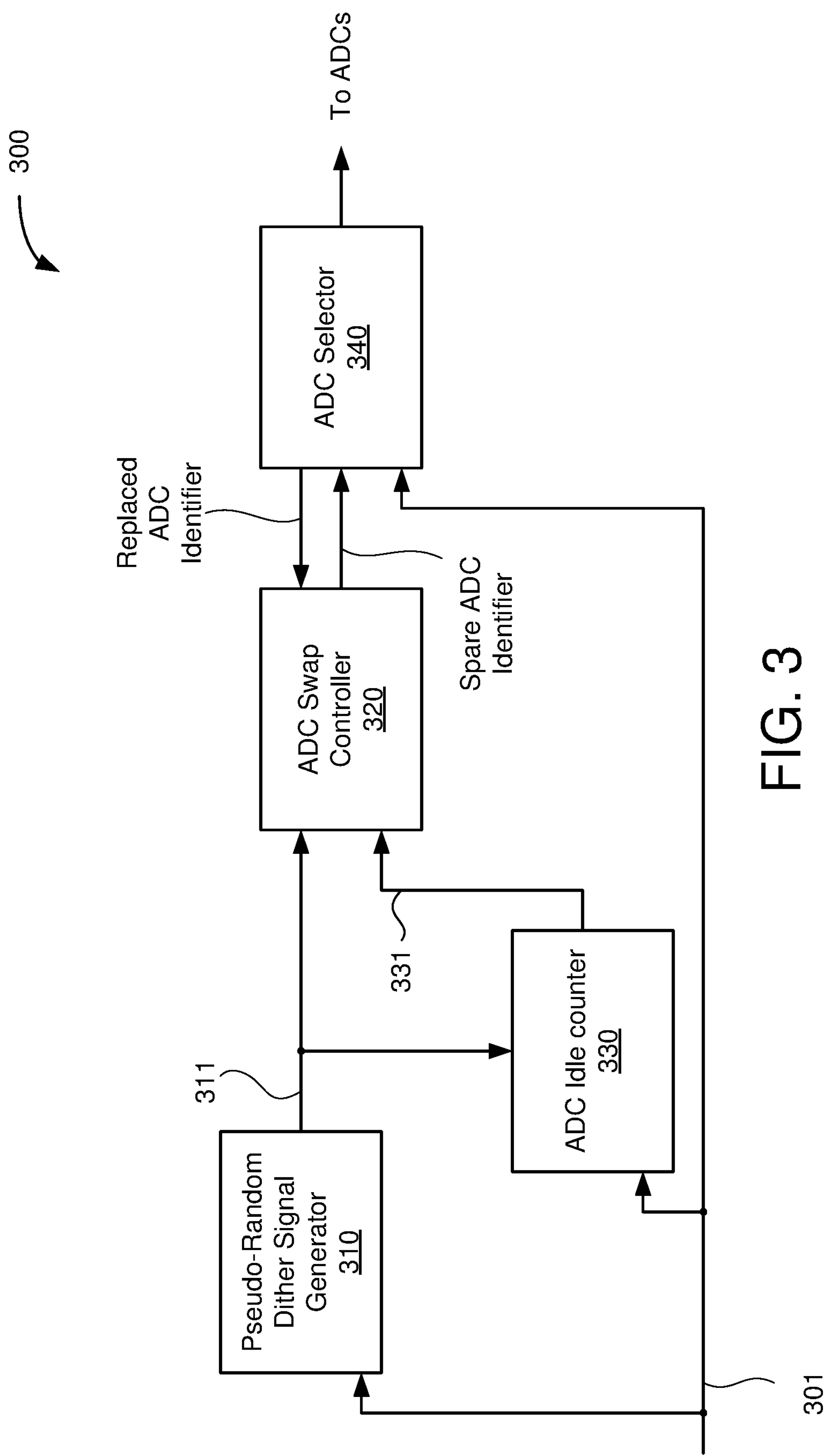
FIG. 3 is a block diagram of an interleaved ADC controller.

FIG. 3 is a block diagram of an interleaved ADC controller 300. The interleaved ADC controller 300 may be one example of the interleaved ADC controller 230 of FIG. 2. The interleaved ADC controller 300 may include a pseudo-random dither signal generator 310, an ADC swap controller 320, an ADC idle counter 330, and an ADC selector 340.

As described above, an interleaving sequence may be a sampling order in which interleaved ADCs sample the analog signal. Operating a number of ADCs in a static interleaving sequence may result in ADC errors. For example, a first ADC may have a first frequency response, non-linearity, or other response characteristic. A second ADC may have a second frequency response, non-linearity or other response characteristic, different from the first ADC. As the ADCs are selected based on the static interleaving sequence, the different response characteristics of the ADCs may unintentionally appear as periodic characteristics of the sampled analog signal.

To reduce these ADC errors, a spare ADC may be randomly substituted for one of the ADCs in the interleaving sequence. However, allowing the spare ADC to be idle (e.g., not actively be used to sample the analog signal) for an extended period, may allow some internal circuits of the spare ADC to discharge. For example, some ADCs may include switched capacitor circuits that discharge over a time period (referred to herein as a leakage time period) when the ADC is not in use. Thus, the leakage time period may be related to the discharge rate of one or more capacitors associated with the ADCs. When the spare ADC becomes active after sitting idle for a time greater than or equal to the leakage time period, the discharged circuits may cause ADC conversion errors.

In some implementations, the ADC idle counter 330 may be used to keep track of an elapsed idle time and determine when to use the spare ADC in the interleaving sequence. For example, the ADC idle counter 330 may count ADC sample clock 301 cycles to determine how long (in terms of elapsed sample clock periods) the spare ADC has been idle. The spare ADC may be substituted for one of the ADCs in the interleaving sequence when the count value of the ADC idle counter 330 meets or exceeds a count value associated with the leakage time period. In some implementations, the ADC sample clock 301 may be one example of the ADC sample clock 231 of FIG. 2. Operation of the ADC idle counter 330 is described in more detail below.

The interleaving sequence may be controlled, at least in part, by the ADC selector 340. In some implementations, the ADC selector 340 may include a barrel shifter having a number of "circularly linked" registers. Each register may be logically linked to another register to form a "circle" of registers, where the output of one register is coupled to an input of another register. For example, if the barrel shifter includes M registers, the output of the first register may be coupled to the input of the second register. The output of the second register may be coupled to the input of the third register, and so on. The output of the Mth register may be coupled to the input of the first register. The barrel shifter may logically rotate the contents of the M registers through M positions. Thus, the contents of a first register of the barrel shifter can rotate though the M positions of the barrel shifter.

Each register of the barrel shifter may store an ADC identifier associated with the interleaving sequence. With reference to the example of FIG. 2, the barrel shifter may include four registers (not shown for simplicity) to store the four ADC identifiers of the ADCs 220-223 included in the interleaving sequence. The ADC 224 may be designated the spare ADC. The ADC selector 340 may select the ADC associated with the ADC identifier stored in a first position of the barrel shifter to sample the analog signal. As the contents of the registers of the barrel shifter circularly rotate based on the ADC sample clock 301, contents of a new register rotate into the first position. Thus, after a barrel shifter rotation, the ADC identifier in the first position may be used to sample the analog signal. In this manner, the registers of the barrel shifter may encode the interleaving sequence.

The pseudo-random dither signal generator 310 may generate a one-bit dither signal 311 based on the ADC sample clock 301 that is used to randomly substitute the spare ADC into the interleaving sequence. In some implementations, the pseudo-random dither signal generator 310 may include a pseudo-random number (prn) generator, a seed value, or any other feasible source, circuit, or device to generate a random or pseudo-random signal (e.g., the one-bit dither signal 311). The one-bit dither signal 311 may randomly be asserted to a first value (e.g., '1') or de-asserted to a second value (e.g., '0'). The one-bit dither signal 311 may be provided to the ADC swap controller 320 to cause the spare ADC to be substituted for one of the ADCs in the interleaving sequence.

The ADC swap controller 320 may store an ADC identifier associated with the spare ADC (referred to herein as the "spare ADC identifier"). In some implementations, the ADC swap controller 320 may adjust the interleaving sequence by substituting the spare ADC identifier for one of the ADC identifiers stored in the ADC selector 340 based, at least in part, on the one-bit dither signal 311 or a swap signal 331. For example, when the one-bit dither signal 311 or the swap signal 331 is asserted, the ADC swap controller 320 may replace one of the ADC identifiers in the ADC selector 340 with the spare ADC identifier. (The swap signal 331 is described below with respect to the ADC idle counter 330.) In some implementations, the spare ADC identifier may be swapped with an ADC identifier in a second position of the barrel shifter. Consistently swapping the spare ADC at the second position of the barrel shifter may provide predictable pipeline delays for the ADCs thereby enabling the completion of ADC conversions already in progress. Although described herein with respect to the second position of the barrel shifter, in other implementations any feasible position of the barrel shifter may be used. The ADC identifier replaced by the spare ADC identifier is then stored by the ADC swap controller 320 as the next spare ADC identifier.

The ADC idle counter 330 may receive the one-bit dither signal 311 and the ADC sample clock 301. The ADC idle counter 330 may count ADC sample clocks 301 for which the spare ADC is idle. The count of ADC sample clocks 301 may be used to determine the idle time of the spare ADC. As described above, when the one-bit dither signal 311 is not asserted, the spare ADC is idle. Thus, the ADC idle counter 330 may count the number of consecutive ADC sample clocks where the one-bit dither signal is not asserted to determine an idle duration time of the spare ADC. When the count value of the ADC idle counter 330 meets or exceeds a threshold number, the ADC idle counter 330 may assert the swap signal 331. As described above, the swap signal 331 causes the ADC swap controller 320 to replace one of the ADC identifiers in the ADC selector 340 with the spare ADC identifier. In some implementations, the threshold number may be based on the leakage time period of the ADCs. When an idle duration of an ADC exceeds the leakage time period, ADC circuits, such as switched capacitor circuits, may be discharged from non-use. Therefore, the threshold number may be less than the leakage time period.

The ADC idle counter 330 may be reset to zero after the swap signal 331 is asserted or the one-bit dither signal 311 is asserted. Because a "new" spare ADC becomes idle due to a swap caused by either an asserted swap signal 331 or an asserted one-bit dither signal 311, the ADC idle counter 330 is reset to zero to determine the idle duration of the new spare ADC. Further, in some implementations, some counters or registers may be initialized at least once prior to a first use. For example, the barrel shifter registers of the ADC selector 340 may be loaded with ADC identifiers before ADC sampling begins. Other counters or registers may be similarly initialized.

Figure 4:
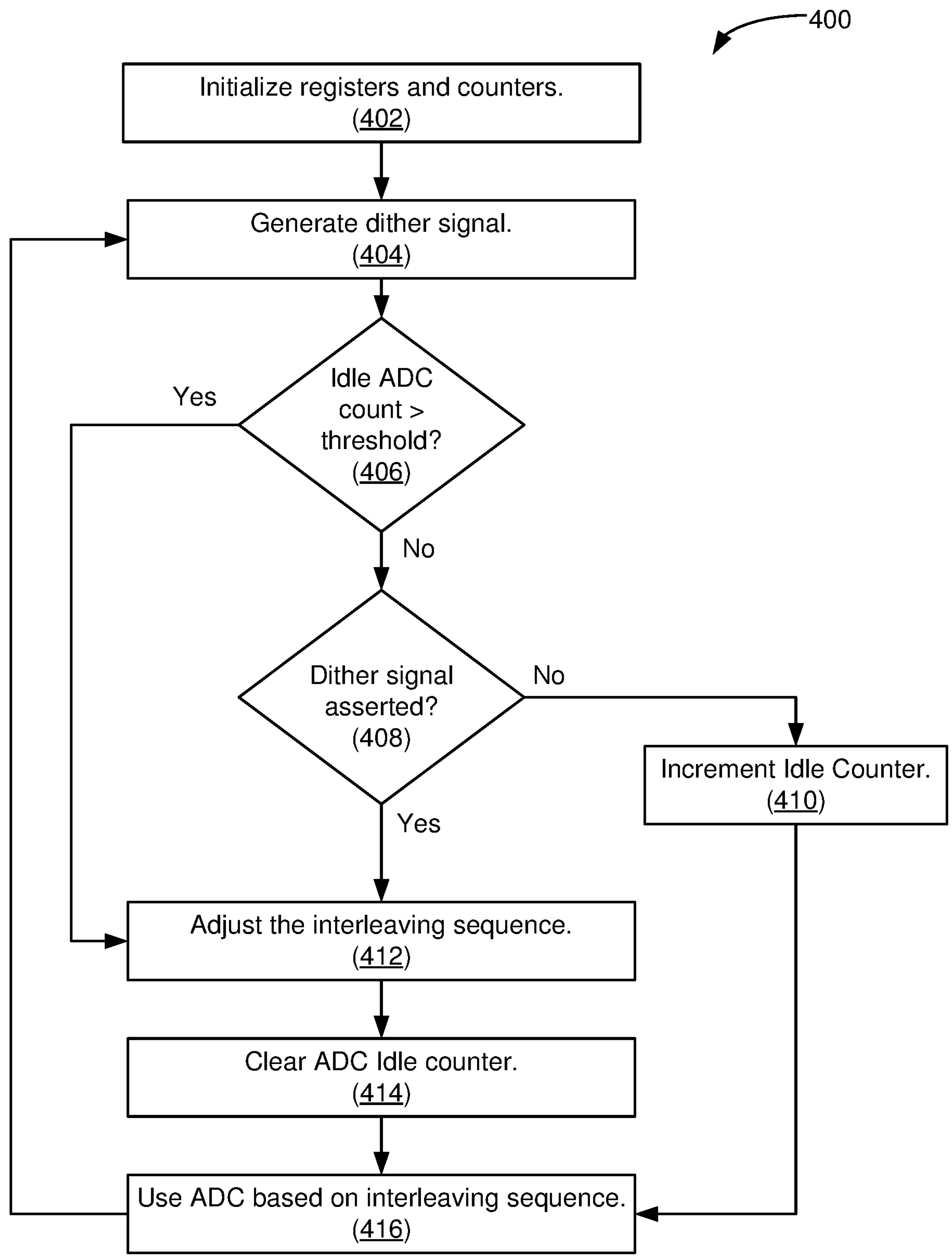
FIG. 4 shows an illustrative flow chart depicting an example operation for operating an interleaved ADC subsystem.

FIG. 4 shows an illustrative flow chart depicting an example operation 400 for operating an interleaved ADC system. Although described herein as being performed by the interleaved ADC controller 300 of FIG. 3, the operation 400 may be performed by the interleaved ADC controller 230 of FIG. 2, or any technically feasible processor, device, circuit, state machine, or the like. Some implementations may perform the operations described herein with additional operations, fewer operations, operations in a different order, operations in parallel, and/or some operations differently.

The operation 400 begins as the interleaved ADC controller 300 initializes registers and counters (402). For example, the interleaved ADC controller 300 may determine which ADCs are in the interleaving sequence, determine which ADC is the spare ADC, initialize the ADC idle counter 330 and the ADC selector 340, and the like. Next, the interleaved ADC controller 300 may generate a dither signal (404). In some implementations, the interleaved ADC controller 300 may include a pseudo-random dither signal generator 310 to generate a one-bit dither signal 311 based on the ADC sample clock 301. As described above, the ADC sample clock 301 may be a clock signal with a frequency related to and/or based on an overall sampling frequency of an interleaved ADC system.

Next, the interleaved ADC controller 300 compares the count of the ADC idle counter 330 to a threshold (406). The ADC idle counter 330 may determine the number of ADC sample clocks 301 that the spare ADC has been idle. The threshold may be a number of ADC sample clocks 301 that are related to a leakage time period of the ADCs. If the number of ADC sample clocks 301 is not greater than the threshold, then the ADC controller 300 determines if the dither signal is asserted (408). If the dither signal is asserted, then the interleaved ADC controller 300 adjusts the interleaving sequence (412). For example, the interleaved ADC controller 300 may adjust the interleaving sequence by inserting the spare ADC into the interleaving sequence. In some implementations, the interleaved ADC controller 300 may replace an ADC indicator in the ADC selector 340 with the spare ADC indicator. Next, the interleaved ADC controller 300 clears the ADC idle counter 330 (414). Since the spare ADC is being used in the interleaving sequence, a new spare ADC is designated, and the ADC idle counter 330 may be cleared or reset to zero to determine the idle duration of the new spare ADC. Next, the interleaved ADC controller 300 may use the ADC determined by the interleaving sequence (416) and the operation returns to 404.

Returning to 408, if the dither signal is not asserted, then the ADC idle counter 330 is incremented (410). Since the dither signal is not asserted, the spare ADC is not used for at least one cycle of the ADC sample clock 301. Thus, the ADC idle counter 330 is incremented to track the idle time of the spare ADC. The operation proceeds to 416.

Returning to 406, if the count of the ADC idle counter 330 is greater than the threshold, then the operation proceeds to 412 and the interleaving sequence is adjusted. Thus, the spare ADC may be inserted into interleaving sequence independent of the state of the dither signal prior to expiry of a leakage time period based on the count value of the ADC idle counter 330. The operation proceeds to 414.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An interleaved analog-to-digital (ADC) controller comprising:
 a counter configured to increment a count value based on a number of elapsed clock cycles of a sample clock; and
 an ADC selector coupled to a number (N) of ADCs, the ADC selector being configured to:
  select a first subset of the N ADCs to sample an analog signal in an interleaving sequence, the interleaving sequence including N−1 ADCs; and
  selectively adjust the interleaving sequence to include a second subset of the N ADCs based at least in part on the count value of the counter, the second subset of ADCs being different than the first subset.

2. The interleaved ADC controller of claim 1, wherein the ADC selector is to selectively adjust the interleaving sequence by:
 determining that the count value exceeds a threshold value; and
 replacing the first subset of ADCs in the interleaving sequence with the second subset of ADCs responsive to the determining that the count value exceeds the threshold value.

3. The interleaved ADC controller of claim 2, wherein the threshold value represents a rate of discharge of one or more capacitors associated with the N ADCs.

4. The interleaved ADC controller of claim 2, wherein the counter is configured to reset the count value after the number of elapsed clock cycles reaches or exceeds the threshold value.

5. The interleaved ADC controller of claim 1, wherein the ADC selector is to selectively adjust the interleaving sequence by:
 receiving a pseudo-random dither signal; and
 determining that the pseudo-random dither signal is asserted.

6. The interleaved ADC controller of claim 5, wherein the counter is configured to:
 reset the count value responsive to the determining that the pseudo-random dither signal is asserted.

7. The interleaved ADC controller of claim 1, wherein the ADC selector is further configured to select one of the ADCs in the interleaving sequence to sample the analog signal for each clock cycle of the sample clock.

8. An interleaved analog-to-digital converter (ADC) system comprising:
 a number (N) ADCs configured to sample an analog signal; and
 an interleaved ADC controller comprising:
  a counter configured to increment a count value based on a number of elapsed clock cycles of a sample clock; and
  an ADC selector coupled to the N ADCs, the ADC selector being configured to:
   select a first subset of the N ADCs to sample an analog signal in an interleaving sequence, the interleaving sequence including N−1 ADCs; and
   selectively adjust the interleaving sequence to include a second subset of the N ADCs based at least in part on the count value of the counter, the second subset of ADCs being different than the first subset.

9. The interleaved ADC system of claim 8, wherein the ADC selector is to selectively adjust the interleaving sequence by:
 determining that the count value exceeds a threshold value; and
 replacing the first subset of ADCs in the interleaving sequencing with the second subset of ADCs responsive to the determining that the count value exceeds the threshold value.

10. The interleaved ADC system of claim 9, wherein the threshold value represents a rate of discharge of one or more capacitors associated with the N ADCs.

11. The interleaved ADC system of claim 9, wherein the counter is configured to reset the count value after the number of elapsed clock cycles reaches or exceeds the threshold value.

12. The interleaved ADC system of claim 8, wherein the ADC selector is to selectively adjust the interleaving sequence by:

receiving a pseudo-random dither signal; and determining that the pseudo-random dither signal is asserted.

13. The interleaved ADC system of claim 12, wherein the counter is configured to:

reset the count value responsive to the determining that the pseudo-random dither signal is asserted.

14. The interleaved ADC system of claim 8, wherein the ADC selector is further configured to select one of the ADCs in the interleaving sequence to sample the analog signal for each clock cycle of the sample clock.

15. A method for sampling an analog signal with a number (N) interleaved analog-to-digital converters (ADCs), the method comprising:

incrementing a count value of a counter based on a number of elapsed clock cycles of a sample clock;

selecting a first subset of the N ADCs to sample the analog signal in an interleaving sequence, the interleaving sequence including N−1 ADCs; and selectively adjusting the interleaving sequence to include a second subset of the N ADCs based at least in part on the count value of the counter, the second subset of ADCs being different than the first subset.

16. The method of claim 15, wherein the selectively adjusting comprises:

determining that the count value exceeds a threshold value; and replacing the first subset of ADCs in the interleaving sequence with the second subset of ADCs responsive to determining that the count value exceeds the threshold value.

17. The method of claim 16, wherein the threshold value represents a rate of discharge of one or more capacitors associated with the N ADCs.

18. The method of claim 16, wherein the counter is configured to reset the count value after the number of elapsed clock cycles reaches or exceeds the threshold value.

19. The method of claim 15, further comprising receiving a pseudo-random dither signal; and determining that the pseudo-random dither signal is asserted, wherein the selectively adjusting is responsive to the determining that the pseudo-random dither signal is asserted.

20. The method of claim 19, further comprising:

resetting the count value responsive to the determining that the pseudo-random dither signal is asserted.

* * * * *